(12) United States Patent
Iwai et al.

(10) Patent No.: US 9,017,479 B2
(45) Date of Patent: Apr. 28, 2015

(54) NITRIDE SINGLE CRYSTAL MANUFACTURING APPARATUS

(75) Inventors: Makoto Iwai, Kasugai (JP); Takanao Shimodaira, Nagoya (JP); Takatomo Sasaki, Suita (JP); Yusuke Mori, Suita (JP); Fumio Kawamura, Suita (JP); Shiro Yamasaki, Nishikasugai-Gun (JP)

(73) Assignees: NGK Insulators, Ltd., Nagoya (JP); Osaka University, Suita (JP); Toyoda Gosei Co., Ltd., Nishikasugai-Gun (JP)

( * ) Notice: Subject to any disclaimer, the term of this patent is extended or adjusted under 35 U.S.C. 154(b) by 1063 days.

(21) Appl. No.: 12/181,402

(22) Filed: Jul. 29, 2008

(65) Prior Publication Data

US 2008/0282971 A1    Nov. 20, 2008

Related U.S. Application Data

(63) Continuation of application No. PCT/JP2007/055788, filed on Mar. 14, 2007.

(30) Foreign Application Priority Data

Mar. 23, 2006   (JP) ................................ 2006-080126

(51) Int. Cl.
- C30B 35/00 (2006.01)
- C30B 11/04 (2006.01)
- C30B 9/10 (2006.01)
- C30B 19/02 (2006.01)
- C30B 19/06 (2006.01)

(Continued)

(52) U.S. Cl.
CPC . C30B 9/10 (2013.01); C30B 19/02 (2013.01); C30B 19/06 (2013.01); C30B 29/406 (2013.01); C30B 35/002 (2013.01); C30B 7/00 (2013.01); Y10S 117/90 (2013.01)

(58) Field of Classification Search
USPC ................. 117/200, 204, 206, 216, 224, 900; 257/1
See application file for complete search history.

(56) References Cited

U.S. PATENT DOCUMENTS 2,404,364 A * 7/1946 Cooper et al. ................ 266/204
5,004,712 A * 4/1991 Borglum ...................... 264/2.1
(Continued)

FOREIGN PATENT DOCUMENTS

JP    62197390 A * 9/1987
JP    2002-068897 A1  3/2002
(Continued)

OTHER PUBLICATIONS

Kawamura et al., "Growth of Large/Low-Dislocation GaN Single Crystal by LPE Growth," Journal of Japanese Association for Crystal Growth, vol. 32, No. 1, 2005, pp. 3-9.
(Continued)

*Primary Examiner* — Matthew Song
(74) *Attorney, Agent, or Firm* — Burr & Brown, PLLC

(57) ABSTRACT

The apparatus has a crucible for storing a solution; an inner container for storing a crucible; a heating container for storing the inner container, the heating container including heating elements, a container body provided with the heating elements and a lid combined with the container body; and a pressure vessel for storing the heating container and for charging an atmosphere comprising at least nitrogen gas. The lid also has a fitting surface to the container body that is inclined to a horizontal plane.

5 Claims, 3 Drawing Sheets

(51) Int. Cl.
 C30B 29/40 (2006.01)
 C30B 7/00 (2006.01)

(56) References Cited

U.S. PATENT DOCUMENTS

| | | | |
|---|---|---|---|
| 5,900,060 A * | 5/1999 | Nause et al. | 117/223 |
| 6,592,663 B1 * | 7/2003 | Sarayama et al. | 117/68 |
| 6,949,140 B2 * | 9/2005 | Sarayama et al. | 117/81 |
| 7,381,268 B2 * | 6/2008 | Minemoto et al. | 117/216 |
| 7,625,446 B2 * | 12/2009 | D'Evelyn et al. | 117/11 |
| 7,754,012 B2 * | 7/2010 | Minemoto et al. | 117/89 |
| 2003/0164138 A1 | 9/2003 | Sarayama et al. | |
| 2005/0087753 A1 * | 4/2005 | D'Evelyn et al. | 257/98 |
| 2006/0037529 A1 * | 2/2006 | D'Evelyn et al. | 117/36 |
| 2006/0144324 A1 * | 7/2006 | Sakaguchi et al. | 117/89 |
| 2006/0177362 A1 * | 8/2006 | D'Evelyn et al. | 422/245.1 |
| 2007/0209575 A1 * | 9/2007 | Iwai et al. | 117/78 |
| 2008/0216737 A1 * | 9/2008 | Sarayama et al. | 117/206 |
| 2008/0299020 A1 * | 12/2008 | Yamazaki et al. | 422/208 |
| 2009/0000542 A1 * | 1/2009 | Iwai et al. | 117/206 |
| 2009/0013924 A1 * | 1/2009 | Iwai et al. | 117/64 |

FOREIGN PATENT DOCUMENTS

| | | |
|---|---|---|
| JP | 2002-293696 A1 | 10/2002 |
| JP | 2003-238296 A1 | 8/2003 |
| JP | 2003-292400 A1 | 10/2003 |
| JP | 2005-132663 A1 | 5/2005 |
| WO | 2005/095682 A1 | 10/2005 |
| WO | WO 2005095682 A1 * | 10/2005 |

OTHER PUBLICATIONS

Kawamura et al., "*The LPE-Growth of GaN Single Crystal in High Temperature Solution with Thermal Convection, Part I*," Journal of Japanese Association for Crystal Growth, vol. 31, No. 3, 2004, p. 113.
U.S. Appl. No. 12/190,230, filed Aug. 12, 2008, Iwai et al.
U.S. Appl. No. 12/192,428, filed Aug. 15, 2008, Iwai et al.
U.S. Appl. No. 12/212,722, filed Sep. 18, 2008, Iwai et al.
U.S. Appl. No. 12/234,786, filed Sep. 22, 2008, Imai et al.
U.S. Appl. No. 12/234,799, filed Sep. 22, 2008, Imai et al.
U.S. Appl. No. 12/284,470, filed Sep. 22, 2008, Ichimura et al.

* cited by examiner

Fig. 1

NITRIDE SINGLE CRYSTAL MANUFACTURING APPARATUS

FIELD OF THE INVENTION

The present invention relates to a method and apparatus for producing a nitride single crystal using Na flux or the like.

BACKGROUND OF THE INVENTION

Gallium nitride-based III-V nitride, which is attracting attention as an excellent blue light emitting element, is put into practical use in light emitting diode field, and expected also as a light pick-up blue-violet semiconductor laser element. In a process for growing a gallium nitride single crystal by Na flux method, a mixed gas of nitrogen and ammonia is used with an atmospheric pressure of 10 to 100 atoms, for example, in Japanese Patent Publication No. 2002-293696A. In Japanese Patent Publication No. 2003-292400A, also, the atmospheric pressure during the growth is 100 atm or less, with 2, 3, and 5 MPa (about 20 atm, 30 atm and 50 atm) being used in the working examples thereof.

On the other hand, the applicant disclosed a method for efficiently growing a gallium nitride single crystal under a specific condition by use of a hot isostatic pressing (HIP) apparatus in Japanese Patent Application No. 2004-103093 (WO 2005/095682 A1).

It is described in "Growth of Large/Low-Dislocation GaN Single Crystal by LPE Growth" by Kawamura et al. in "Journal of Japanese Association for Crystal Growth" Vol. 32, No. 1, 2005 that when a GaN single crystal is grown by Na flux method, the GaN single crystal is susceptible to blackening due to existence of nitrogen defects.

It is also described in Japanese Patent Publication No. 2005-132663A that in growth of a nitride single crystal in a flux containing lithium, a reaction vessel which contacts with the flux is formed of metallic tantalum to thereby prevent breakage of the reaction vessel.

SUMMARY OF THE INVENTION

However, it is known that the crystal growth by such flux method using heating and pressurizing apparatuses involves the following problems. Namely, it is extremely difficult to retain the uniformity of temperature within a furnace in actual growth of nitride single crystal in an industrial scale, and this may cause an uneven growing state of crystal or an increased rate of defects.

The present invention thus has an object to prevent, in growth of nitride single crystal within a furnace by flux method, the unevenness in growing state of the nitride single crystal and the increase in rate of defects resulting from a difference in temperature within the furnace.

A first aspect of the invention provides an apparatus for growing a nitride single crystal using a solution containing a flux and a raw material, the apparatus preferably includes:
a crucible for storing the solution;
an inner container for storing the crucible;
a heating container for storing the inner container, the heating container comprising a heating element, a container body equipped with the heating element and a lid fitted to the container body; and
a pressure vessel for storing the heating container and charging an atmosphere containing at least nitrogen gas, wherein the fitting surface of the lid to the container body is inclined to a horizontal plane.

A second aspect of the invention provides an apparatus for growing a nitride single crystal using a solution containing a flux and a raw material, the apparatus preferably includes:
a crucible for storing the solution;
an inner container for storing the crucible;
a heating container for storing the inner container, the heating container including a heating element, a container body equipped with the heating element and a lid fitted to the container body;
a pressure vessel for storing the heating container and charging an atmosphere containing at least nitrogen gas; and
a support member for supporting the inner container above the container body, wherein a closed space is formed by the support member, the heating container and the inner container, and wherein at least one of the heating element faces the closed space.

A third aspect of the invention provides an apparatus for growing a nitride single crystal using a solution containing a flux and a raw material, the apparatus preferably includes:
a crucible for storing the solution;
an inner container for storing the crucible;
a heating container for storing the inner container, the heating container including a heating element, a container body equipped with the heating element and a lid fitted to the container body;
a pressure vessel for storing the heating container and charging an atmosphere containing at least nitrogen gas; and
energizing means for energizing the lid toward the container body from the pressure vessel side.

A fourth aspect of the invention provides an apparatus for growing a nitride single crystal using a solution containing a flux and a raw material, the apparatus preferably includes:
a crucible for storing the solution;
an inner container for storing the crucible;
a heating container for storing the inner container, the heating container including a heating element, a container body equipped with the heating element and a lid fitted to the container body;
a pressure vessel for storing the heating container and charging an atmosphere containing at least nitrogen gas; and
a cylindrical heat insulating member provided between an outer wall surface of the heating container and an inner wall surface of the pressure vessel.

According to the first aspect of the invention, the inner container containing the crucible is preferably placed within the heating container. The heating container includes the heating element, the container body provided with the heating element, and the lid combined with the container body. By inclining the fitting surfaces of the container body and the lid to the horizontal plane, the hot atmosphere within the heating container is prevented from escaping along the fitting surfaces of the container body and the lid. The temperature gradient within the inner container can be thus reduced even in a high-temperature pressurizing condition for growing the nitride single crystal. Consequently, the quality of the single crystal can be improved to reduce the defects.

According to the second aspect of the invention, the closed space is preferably formed by the support member, the heating container and the inner container inside the heating container, and at least one of the heating elements is provided below the closed space. According to such structure, heat can be directly supplied upwardly to the closed space from the heater to replenish the heat escaping upward within the heating container from the closed space side. The temperature gradient within the heating container and also within the inner container can be further reduced. Consequently, the quality of the single crystal can be improved to reduce the defects.

According to the third aspect of the invention, the energizing means is preferably provided for energizing the lid of the heating container toward the container body from the pressure vessel side. The hot atmosphere within the heating container can be prevented from escaping along the fitting surfaces of the container body and the lid, so that the temperature gradient within the inner container can be thus reduced even in a high-temperature pressurizing condition for growing the nitride single crystal. Consequently, the quality of the single crystal can be improved to reduce the defects.

According to the fourth aspect of the invention, by preferably providing the tubular heat insulating member between the outer wall surface of the heating container and the inner wall surface of the pressure vessel, the difference in temperature by thermal convection can suppressed. The temperature gradient within the inner container can be thus reduced even under a high-temperature pressurizing condition for growing the nitride single crystal. Consequently, the quality of the single crystal can be improved to reduce the defects.

BRIEF DESCRIPTION OF THE DRAWINGS

FIG. 1 is a schematic view of a growth apparatus according to the present invention.

DETAILED DESCRIPTION OF THE INVENTION

The present invention will be further described in detail according to each of the first to fourth embodiments.

Figure 1:
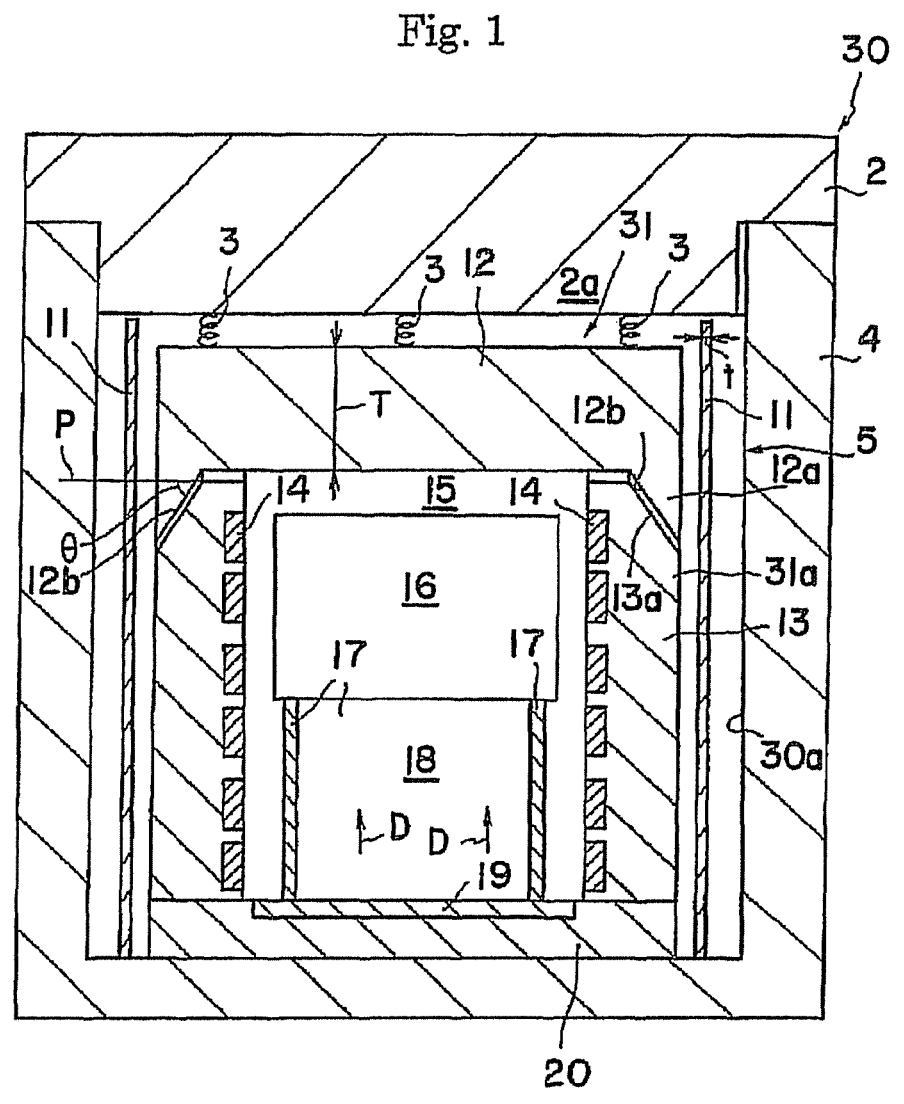
Figure 2:
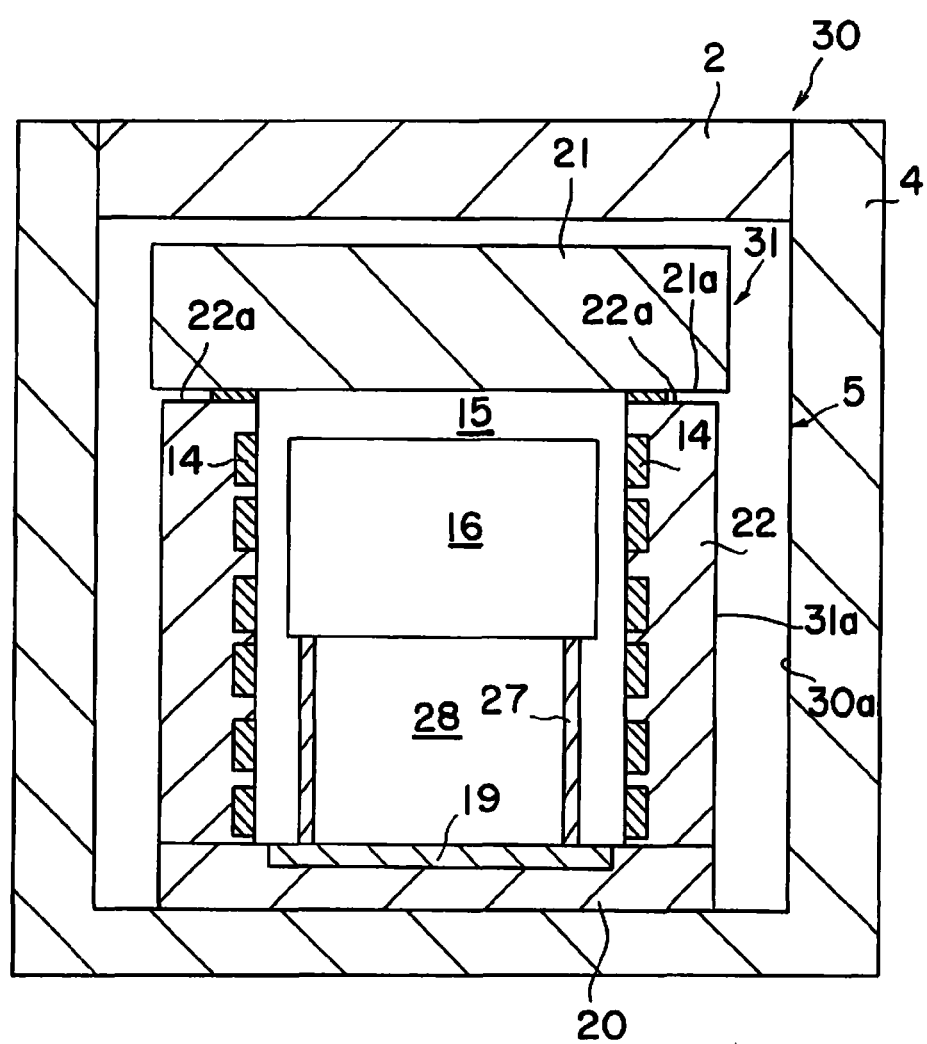
FIG. 2 is a schematic view of a growth apparatus as a reference example.

FIG. 1 schematically shows an apparatus for executing the present invention. FIG. 2 schematically shows an apparatus as a reference example.

A pressure vessel 30 comprises a main body 4 and a lid 2. The lid 2 includes a projection 2a protruded to the inside. A heating container 31 is set in an internal space 5 of the vessel 30. The heating container 31 comprises a lid 12 and a container body 13. Each of the container body 13 and the lid 12 is at least partially formed of a furnace material. In this embodiment, a series of heating elements 14 are provided so as to face the inside surface of the container body 13. A heating element 19 is provided on a bottom plate part 20 of the container body 13.

In this embodiment, the lid 12 includes a flange part 12a, and a fitting surface 12b of the lid 12 is inclined at an angle θ to a horizontal plane P. A fitting surface 13a of the container body 13, which is to abut on the fitting surface 12a, is inclined also at the angle θ to the horizontal plane P. The fitting surface 12b is inclined to lower toward the outside in a view from the center of the container body.

A cylindrical heat insulating members 11 are set between an outer wall surface 31a of the heating container 31 and an inner wall surface 30a of the pressure vessel 30. The heat insulating members 11 are vertically extended substantially over the whole height of the internal space 5. Energizing means 3 is provided between the projection 2a of the lid 2 and the upper surface of the lid 12, so that the lid 12 is energized toward the container body 13 by the energizing means 3.

An inner container 16 is set within an internal space 15 of the heating container 31. The inner container 16 is supported above the bottom plate part 20 of the container body of the heating container 31 through support members 17, with the bottom surface of the inner container 16 being in contact with the upper ends of the support members 17. The support members 17 have, for example, a cylindrical shape, and a substantially closed space 18 is formed by the bottom plate part 20, the support members 17 and the inner container 16. The heating element 19 mounted on the bottom plate part 20 faces the closed space 18.

Figure 3:
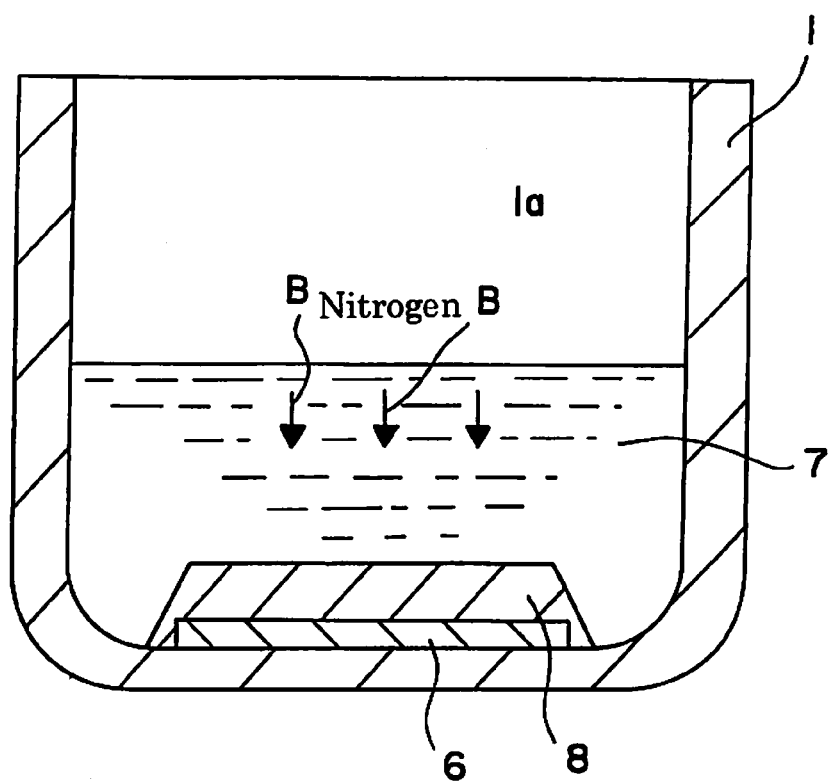
FIG. 3 is a schematic sectional view of a crucible 1, which shows the growing state of a single crystal 8 within the crucible 1.

A crucible 1, for example, shown in FIG. 3 is set within the inner container 16, and a seed crystal 6 is immersed in a solution 7 produced within the crucible 1.

A mixed gas cylinder not shown is provided outside the pressure vessel 30. The mixed gas cylinder is filled with a mixed gas having a predetermined composition, and the mixed gas is compressed to a predetermined pressure by a compressor, and supplied into the pressure vessel 30 through a supply pipe not shown. Of this atmosphere, nitrogen is used as a nitrogen source, and an inert gas such as argon suppresses vaporization of flux such as sodium. The pressure of the atmosphere is monitored by a pressure gauge not shown.

When the heating elements 14 and 19 are heated, and the pressure vessel 30 is internally heated and pressurized by carrying nitrogen gas thereto, mixed raw materials are entirely dissolved within the crucible 1 to form the solution 7, as shown in FIG. 3. If a predetermined single crystal growth condition is retained, a single crystal 8 is grown on the seed crystal 6 with stable supply of nitrogen into the growing raw material solution 7 as shown by arrow B.

FIG. 2 schematically shows an apparatus as a reference example.

A pressure vessel 30 comprises a main body 4 and a lid 2. A heating container 31 is set in an internal space 5 of the vessel 30. The heating container 31 comprises a lid 21 and a container body 22. In this example, a series of heating elements 14 are provided so as to face the inside surface of the container body 22. A heating element 19 is provided on a bottom plate part 20 of the container body 13.

An inner container 16 is set within an internal space 15 of the heating container 31. The inner container 16 is supported above the bottom plate part 20 of the container body of the heating container 31 through a plurality of support legs 27, with the bottom surface of the inner container 16 being in contact with the upper ends of the support legs 27. Three or more support legs 27 are provided and disposed adjacently each through a clearance. Therefore, no closed space is formed by the bottom plate part 20, the support legs 27 and the inner container 16. Namely, a space 28 on the inside of the support legs communicates with the internal space 15 of the heating container 31.

A crucible 1, for example, shown in FIG. 3, is set within the inner container 16, and a seed crystal 6 is immersed in a solution 7 produced within the crucible 1.

In the embodiment of FIG. 1, the hot atmosphere within the heating container 31 can be prevented from escaping along the fitting surfaces of the container body 13 and the lid 12 by inclining the fitting surfaces 12b and 13a of the container body 13 and the lid 12 by the angle θ to the horizontal plane P. Such hot atmosphere tends to collect on the lower side of the lid 12 due to the specific gravity difference, and is hardly discharged out of the container body 13. In the apparatus shown in FIG. 2, the hot atmosphere tends to horizontally flow and discharge out along fitting surfaces 21a and 22a of the lid 21 and the container body 22. Consequently, the heat transfer from down to up is easily promoted within the heating container 31, causing a temperature difference within the internal space 15.

The angle θ of the fitting surfaces 12b and 13a to the horizontal plane P is set preferably to 45° or more, from the viewpoint of the above-mentioned action and function of the present invention, more preferably to 60° or more. By extending the fitting surface 12b, the pathway of the atmosphere to leak can be extended. The upper limit of θ is not particularly limited. However, since an excessively large θ makes the handling difficult, the angle θ is set preferably to 85° or less, more preferably to 80° or less.

In the embodiment of FIG. 1, the substantially closed space 18 is formed by the support members 17, the heating container 31 and the inner container 16 inside the heating container 31, and at least one heating element 19 is provided below the closed space 18. According to this, the heat from the heater 19 can be directly supplied into the closed space 18 to replenish the heat escaping upward within the heating container 31 from the lower side of the closed space 18, to thereby further reduce the temperature gradient within the heating container 31 and also within the inner container 16. Consequently, the quality of the single crystal can be improved to reduce the defects.

The shape of the support member 17 is not particularly limited as long as it can form such a closed space. Although the support members 17 are needed to have a some tube-like shape for forming the closed space, it may have a cross sectional shape such as perfect circle, ellipse, race track-like shape, triangle, or quadrangle without any limitation.

The closed space does not have to be perfectly sealed to the vessel internal space 15, but just has to be substantially closed. For example, the support members 17 can include a cutout or through-hole.

The heating element 19 just has to be located below the lower side of the closed space 18. For example, the heating element may be buried in the furnace material constituting the bottom plate part 20, or be exposed to the surface of the bottom plate part 20.

In this embodiment, the energizing means 3 is provided for energizing the lid 12 of the heating container 31 toward the container body 13 from the pressure vessel 30 side. According to this, the hot atmosphere within the heating container 31 can be prevented from escaping along the fitting surfaces of the container body 13 and the lid 12, and the temperature gradient within the inner container 16 can be reduced even under a high-temperature pressurizing condition for growing the nitride single crystal. Consequently, the quality of the single crystal can be improved to reduce the defects.

The elastic biasing means is never particularly limited, and may be a metallic spring such as coil spring or plate spring. Otherwise, biasing means such as snap lock or weight can be used. The elastic biasing means does not need high heat resistance since it is not subjected to a much higher temperature (generally 200° C. or lower).

In this embodiment, by providing the tubular heat insulating member 11 between the outer wall surface of the heating container 31 and the inner wall surface of the pressure vessel 30, the thermal convection is limited to suppress the temperature difference resulting from the convection. Accordingly, the temperature gradient within the inner container can be reduced even in a high-temperature pressurizing condition for growing the nitride single crystal. Consequently, the quality of the single crystal can be improved to reduce the defects.

The concrete shape of the tubular heat insulating members 11 is not particularly limited. The tubular heat insulating members can have, for example, a cross sectional shape such as perfect circle, ellipse, race track-shape, triangle or quadrangle.

In the present invention, as the furnace material, for example, high alumina refractory brick (Isolite, ISO-COR (trade names), graphitic refractory (GRAFSHIELD (trade name)), and hollow spherulitic fused alumina (alumina bubble) can be used, although the furnace material is not particularly limited thereto.

In the present invention, as the material of the heating element, for example, tantalum, SiC, SiC-coated graphite, nichrome, and Kanthal Super (trade name) can be used although it is not particularly limited thereto.

In the present invention, as the material of the support members for supporting the inner container, for example, SUS 310S, Inconel, tantalum, molybdenum, and tungsten can be used although it is not particularly limited thereto.

In the present invention, a thickness T of the lid 12 of the heating container is set preferably to 70 mm or more, from the viewpoint of reducing the temperature gradient during growth within the heating container, more preferably to 100 mm or more.

In the present invention, the material of the tubular heat insulating members provided between the heating container and the pressure vessel is not particularly limited, and examples thereof include SUS 304, aluminum, quartz glass, and Pyrex glass. The tubular heat insulating members just have to be heat resistant to, for example, 200° C. or higher since it is not subjected to a much higher temperature. For restricting the thermal convection of the high-temperature and high-pressure gas leaked out of the heating container, the space from the heating container is set preferably to be smaller than 5 cm. A plurality of tubular heat resisting members may be set.

A thickness t of the tubular heat insulating member is set preferably to 0.5 mm or more, from the point of the invention and more preferably to 1 mm or more, although it is not particularly limited.

Examples of the seal member between the lid of the heating container and the container body include ceramic fiber, ceramic wool, graphite wool and steel wool.

In the present invention, the growth of the single crystal is performed in an atmosphere containing nitrogen. The nitrogenous atmosphere may be composed only of nitrogen, but can include a non-oxidizing gas other than nitrogen, for example, an inert gas such as argon or a reductive gas.

In the present invention, the device for heating the raw material mixture to produce the solution in the single crystal growth apparatus is not particularly limited. Although a hot isostatic pressing apparatus is preferred as such device, other atmospheric pressurizing type heating furnaces are also usable.

The flux for producing the solution is not particularly limited, but it is preferably composed of one or more metals selected from the group consisting of alkali metals and alkali earth metals, or alloys thereof. As such metals, sodium, lithium and calcium are particularly preferred, and sodium is most preferred.

As materials other than the flux and single crystal raw material to be added to the raw material mixture, for example, potassium, rubidium, cesium, magnesium, strontium, barium and tin can be given.

As a dopant, a small amount of impurity element can be added. For example, silicon can be added as n-type dopant.

By the growing method according to the present invention, for example, the following single crystals can be suitably grown: GaN, AlN, InN, mixed crystal thereof (AlGaInN), and BN The heating temperature and pressure in the single crystal growing process are not particularly limited since they are selected depending on the kind of single crystal to be grown. The heating temperature can be set, for example, to 800 to 1500° C. The pressure is not particularly limited either, but is preferably set to 1 MPa or more, more preferably to 5 MPa or more. The upper limit of the pressure is not particularly regulated, but can be set, for example, to 200 MPa or less.

The material of the crucible for performing the reaction is not particularly limited, and the crucible may be formed of an airtight material having durability under an intended heating and pressurizing condition. Examples of such material include high-melting point metals such as metallic tantalum, tungsten and molybdenum, oxides such as alumina, sapphire and yttria, nitride ceramics such as aluminum nitride, titanium nitride, zirconium nitride and boron nitride, carbides of high-melting point metals such as tungsten carbide and tantalum carbide, and thermal decomposition products such as p-BN (pyrolytic BN) and p-Gr (pyrolytic graphite).

Further concrete single crystals and growing procedures thereof will be then described.

(Growth Example of Gallium Nitride Single Crystal)

The present invention can be used to grow gallium nitride single crystal using a flux containing at least sodium metal. A gallium raw material is mixed to the flux. As the gallium raw material, gallium single metal, a gallium alloy, and a gallium compound are applicable, and gallium single metal is suitably used from the viewpoint of handling.

The flux can include a metal other than sodium, for example, lithium. Although the gallium raw material and the flux raw material such as sodium may be used in an appropriate proportion, excess use of Na is generally considered. This, of course, is not limitative.

In this embodiment, the growth of gallium nitride single crystal is carried out under an atmosphere consisting of a mixed gas containing nitrogen gas at a total pressure ranging from 300 atm to 2000 atm. By setting the total pressure to 300 atm or more, gallium nitride single crystal of good quality could be grown, for example, in a high-temperature range of 900° C. or higher, more preferably in a high-temperature range of 950° C. or higher. This reason is not known exactly, but this is attributable to that the nitrogen solubility is increased according to temperature rise, and nitrogen efficiently dissolves in the growing solution. When the total pressure of the atmosphere is set to 2000 atm or more, the density of the high-pressure gas significantly gets close to that of the growing solution, so that it becomes difficult to retain the growing solution within the vessel for performing the reaction of the growing solution.

TABLE 1

Densities of various materials (g/cm³)

| | Sodium metal | Nitrogen | Argon |
|---|---|---|---|
| 800° C. · 1 atm | 0.75 | 0.0003 | 0.0004 |
| 927° C. · 300 atm | | 0.08 | 01 |
| 927° C. · 1000 atm | | 0.21 | 0.33 |
| 927° C. · 2000 atm | | 0.3 (estimation) | 0.5 (estimation) |

In a preferred embodiment, the nitrogen partial pressure in the atmosphere during growth is set to 100 atm or more and 2000 atm or less. By setting the nitrogen partial pressure to 100 atm or more, gallium nitride single crystal of good quality can be grown in a high-temperature range of, for example, 1000° C. or higher while promoting the dissolution of nitrogen to the flux. From this viewpoint, the nitrogen partial pressure is set more preferably to 200 atm or more. The nitrogen partial pressure is set also preferably to 1000 atm or less from the practical point of view.

Although the gas other than nitrogen in the atmosphere is not particularly limited, an inert gas is preferred, and argon, helium or neon is particularly preferred. The partial pressure of the gas other than nitrogen corresponds to a value obtained by subtracting the nitrogen gas partial pressure from the total pressure.

In a preferred embodiment, the growth temperature of gallium nitride single crystal is set to 950° C. or higher, more preferably to 1000° C. or higher, and even in such a high-temperature range, gallium nitride single crystal of good quality can be grown. The growth at increased temperature and increased pressure can probably improve the productivity.

Although the upper limit of the growth temperature of gallium nitride single crystal is not particularly limited, an excessively high growth temperature makes the crystal growth difficult. Therefore, the growth temperature is set preferably to 1500° C. or lower. From this viewpoint, the temperature is set more preferably to 1200° C. or lower.

As the material of the growth substrate for epitaxially growing the gallium nitride crystal, sapphire, AlN template, GaN template, self-standing GaN substrate, silicon single crystal, SiC single crystal, MgO single crystal, spinel ($MgAl_2O_4$), and perovskite composite oxide such as $LiAlO_2$, $LiGaO_2$, $LaAlO_3$, $LaGaO_3$ or $NdGaO_3$ can be given although it is not particularly limited thereto. A cubic perovskite composite oxide represented by the composition formula $[A_{1-y}(Sr_{1-x}Ba_x)_y][(Al_{1-z}Ga_z)_{1-u}Du]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM ($ScAlMgO_4$) is also usable.

(Growth Example of AlN Single Crystal)

The present invention could be confirmed to be effective for growth of AlN single crystal by pressurizing a melt including a flux containing at least aluminum and alkali earth metal in a specific condition under a nitrogen gas containing atmosphere.

EXAMPLES

Example 1

The apparatus schematically shown in FIG. 1 was used to carry out growth of gallium nitride single crystal.

Concretely, the support members 17 were formed, using SUS 310S, into a cylindrical shape having a diameter φ of 155 cm and a height of 10 cm. Six holes 3 cm in diameter were equally provided on the side surface of the cylindrical support members 17.

As the energizing means 3, four coil springs 3 made of spring steel and having a spring rate of 2 kg/mm were used. The heat insulating members 11 were formed, using stainless (SUS 304), into a cylindrical shape. A thickness of the heat insulating members 11 was 1 mm. The distance between each of the cylindrical heat insulating members and the furnace material was 2 cm, and the distance between each of the cylindrical heat insulating members and the pressure vessel 30 was about 4 cm.

In the lid 12, the angle θ was 60°, and the height of the flange part 2a was 10 cm. A thickness of the lid 12 was 15 cm. The inner container 16 had a diameter of 180 mm and a height of 15 cm.

Using this growth apparatus, temperature distribution in the heating container was measured at internal temperature and pressure of 900° C. and 5 MPa. Consequently, the diameter directional temperature distribution was ±2° C., and the vertical temperature distribution was ±3° C.

The growth of GaN single crystal was carried out using this apparatus. Concretely, metal Na 90 g, metal Ga 100 g and metal Li 130 mg were weighted within a globe box. The metal Ga and metal Li were enclosed by the metal Na. These raw materials were charged in an alumina-made crucible 1 with inside diameter of 70 mm. As the seed crystal 6, an AlN template substrate, GaN template substrate or self-standing GaN single crystal substrate with φ 2 inches was used. The substrate was horizontally disposed on the bottom of the crucible 1 so that the single crystal thin film of the template was upward, or the Ga surface of the self-standing GaN single crystal substrate was upward. The AlN template substrate is a substrate obtained by epitaxially growing an MN single crystal thin film on a sapphire substrate in a thickness of 1 micron, and the GaN template substrate is a substrate obtained by epitaxially growing a GaN single crystal thin film on a sapphire substrate in a thickness of 3 microns.

The pressure vessel 30 was evacuated to vacuum by a vacuum pump for removing the atmosphere within the vessel, gas-substituted by nitrogen gas, raised in temperature and pressure to 900° C. and 50 atm over one hour, and then retained at 900° C. for 100 hours. After naturally allowed to cool to room temperature, the crucible was taken out of the growth apparatus, and treated in ethanol to dissolve Na and Li. Thereafter, the remaining Ga was removed by dipping in diluted hydrochloric acid to take out the resulting GaN single crystal. The GaN single crystal had a substantially circular shape with a grain size of φ2 inches and a thickness of about 5 mm. The crystal was substantially colorless and transparent.

Comparative Example 1

An apparatus as shown in FIG. 2 was manufactured, in which four alumina pipes were set as the support members 27, but the energizing means 3 and the heat insulating members 11 were not provided. As a result of temperature distribution measurement, the temperature within the heating container was distributed so as to become higher toward the top, with a temperature gradient of 50° C. per 10 cm-height in vertical view.

The same growth of GaN single crystal as in Example 1 was carried out using this apparatus. As a result, single crystal of good quality could not be grown.

While specific preferred embodiments have been shown and described, the present invention is never limited by these specific embodiments, and can be carried out with various modifications and substitutions without departing from the spirit and scope of the claims of the present invention.

The invention claimed is:

1. A production apparatus for growing a nitride single crystal using a solution containing a flux and a raw material, said apparatus comprising:
a crucible in which the solution is located;
an inner container in which the crucible is located;
a heating container in which the inner container is located, the heating container comprising a heating element, a container body equipped with the heating element and a lid fitted to the container body;
a pressure vessel in which the heating container is located; and
means for charging an atmosphere, comprising at least nitrogen gas, into the pressure vessel,
wherein a space is present between the pressure vessel and heating container, a space is present between the heating container and the inner container, and a space is present in the crucible over the solution, wherein all said spaces are in gas communication with each other,
wherein the lid has an inclined fitting surface fitted to the container body, and said inclined fitting surface extends in an outwardly downward direction relative to a horizontal plane,
wherein a gap is provided between the lid and the container body along said inclined fitting surface, so that nitrogen gas is supplied to the solution through said gap while escape of hot atmosphere in said heating container through said ca along said inclined fitting surface is reduced during growth of said nitride single crystal, and a thickness of said lid of said heating container is 70 mm or greater.

2. The production apparatus for growing a nitride single crystal according to claim 1, further comprising an elastic biasing means for biasing the lid toward the container body from the pressure vessel side.

3. A production apparatus for growing a nitride single crystal according to claim 2, wherein the elastic biasing means is a spring.

4. A production apparatus for growing a nitride single crystal using a solution containing a flux and a raw material, said apparatus comprising:
a crucible in which the solution is located;
an inner container in which the crucible is located;
a heating container in which the inner container is located, the heating container comprising a container body equipped with a heating element, wherein the container body is positioned at a predetermined distance away from the inner container and a lid is fitted to the container body, the container body comprising a bottom plate and a side wall, and at least one heating element provided in the bottom plate;
a pressure vessel in which the heating container is located; and
means for charging an atmosphere, comprising at least nitrogen gas, into the pressure vessel; and
a support member for supporting the inner container at a predetermined distance above the container body, said support member being tubular and being provided between and in contact with the bottom of the inner container and the top of the bottom plate of the heating container,
wherein the support member, the bottom plate of the heating container and the inner container together define a substantially closed space, and wherein the at least one heating element is provided below the closed space,
wherein a space is present between the pressure vessel and heating container, a space is present between the heating container and the inner container, and a space is present in the crucible over the solution, wherein all said spaces are in gas communication with each other,
wherein a gap is provided between said lid and said container body so that said atmosphere comprising at least nitrogen gas is supplied to the solution through said gap, said gap and said spaces are in gas communication, and a thickness of said lid of said heating container is 70 mm or greater.

5. A production apparatus for growing a nitride single crystal using a solution containing a flux and a raw material, said apparatus comprising:
a crucible in which the solution is located;
an inner container in which the crucible is located;
a heating container in which the inner container is located, the heating container comprising a heating element, a container body equipped with the heating element and a lid fitted to the container body;

a pressure vessel in which the heating container is located, the pressure vessel comprising a lid and a main body, wherein the pressure vessel and the lid form an enclosed environment containing an atmosphere;

means for charging the atmosphere, containing at least nitrogen gas, into the pressure vessel; and a metal, tubular thermal convection restrictor provided between an outer wall surface of the heating container and an inner wall surface of the pressure vessel main body, wherein a space is present between the tubular thermal convection restrictor and the inner wall surface of the pressure vessel main body, a space is present between the tubular thermal convection restrictor and the heating container, a space is present between the lid of the pressure vessel and the lid of the heating container, a space is present between the lid of the pressure vessel and inside of the tubular thermal convection restrictor, a space is present between the heating container and the inner container, and a space is present in the crucible over the solution, wherein all of said spaces are in gas communication with each other, wherein the tubular thermal convection restrictor suppresses a thermal convection of gas in said spaces between the tubular thermal convection restrictor and the heating container, wherein a gap is provided between said lid and said container body so that said atmosphere comprising at least nitrogen gas is supplied to the solution through said gap, said gap and said spaces are in gas communication, and a thickness of said lid of said heating container is 70 mm or greater.

* * * * *